(12) United States Patent
Kim

(10) Patent No.: US 8,441,870 B2
(45) Date of Patent: May 14, 2013

(54) DATA STROBE SIGNAL OUTPUT DRIVER FOR A SEMICONDUCTOR MEMORY APPARATUS

(75) Inventor: Mi Hye Kim, Icheon-si (KR)

(73) Assignee: SK Hynic Inc., Gyeonggi-do (KR)

( * ) Notice: Subject to any disclaimer, the term of this patent is extended or adjusted under 35 U.S.C. 154(b) by 343 days.

(21) Appl. No.: 12/846,358

(22) Filed: Jul. 29, 2010

(65) Prior Publication Data

US 2011/0249520 A1    Oct. 13, 2011

(30) Foreign Application Priority Data

Apr. 12, 2010   (KR) .................... 10-2010-0033135

(51) Int. Cl.
*G11C 7/00* (2006.01)

(52) U.S. Cl.
USPC ............ 365/193; 365/189.15; 365/189.07; 365/230.06; 365/221; 326/30; 326/26; 326/81; 326/83; 327/108

(58) Field of Classification Search .......... 365/193, 365/189.15, 189.07, 230.06, 221, 220; 326/30, 326/26, 81, 83; 327/108
See application file for complete search history.

(56) References Cited

U.S. PATENT DOCUMENTS

| | | | |
|---|---|---|---|
| 6,026,051 A | 2/2000 | Keeth et al. | |
| 6,160,731 A | 12/2000 | Choi | |
| 6,349,399 B1 | 2/2002 | Manning | |
| 6,636,110 B1 | 10/2003 | Ooishi et al. | |
| 6,643,789 B2 | 11/2003 | Mullarkey | |
| 7,224,625 B2 | 5/2007 | Dietrich et al. | |
| 7,760,561 B2 * | 7/2010 | Lee | 365/189.15 |
| 7,906,986 B2 * | 3/2011 | Lee | 326/30 |
| 8,077,529 B2 * | 12/2011 | Lee | 365/189.15 |
| 2004/0066855 A1 * | 4/2004 | Cranford et al. | 375/295 |

FOREIGN PATENT DOCUMENTS

| | | |
|---|---|---|
| JP | 11-316617 | 11/1999 |
| JP | 11-328963 | 11/1999 |
| KR | 1020090011558 A | 2/2009 |
| KR | 100940854 B1 | 1/2010 |

* cited by examiner

*Primary Examiner* — Connie Yoha
(74) *Attorney, Agent, or Firm* — William Park & Associates Patent Ltd.

(57) ABSTRACT

A data strobe signal output driver includes a trigger block, a predriver block, and a main driver block. The trigger block is configured to receive a first signal, a second signal, a first clock and a second clock, and to output a predrive signal based thereon. The predriver block is configured to receive the predrive signal, a driver off signal and a termination enable signal, and to output a first main drive signal and a second main drive signal based thereon. The main driver block is configured to output a data strobe signal based on the first and second main drive signals.

13 Claims, 5 Drawing Sheets

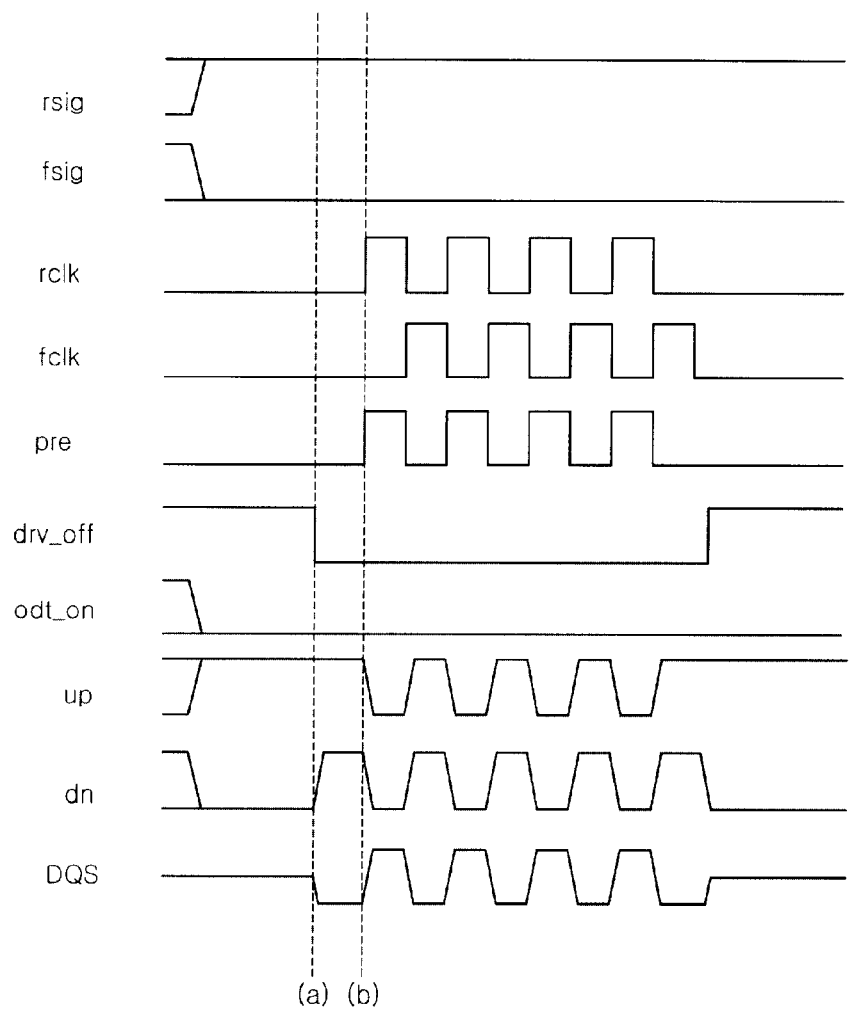

DATA STROBE SIGNAL OUTPUT DRIVER FOR A SEMICONDUCTOR MEMORY APPARATUS

CROSS-REFERENCES TO RELATED APPLICATION

The present application claims priority under 35 U.S.C. §119(a) to Korean application number 10-2010-0033135, filed on Apr. 12, 2010, in the Korean Intellectual Property Office, which is incorporated herein by reference in its entirety.

BACKGROUND

1. Technical Field

The present invention relates to an output driver, and more particularly, to an output driver for outputting a data strobe signal.

2. Related Art

A data strobe signal output driver is used to output a data strobe signal (DQS) in a semiconductor memory apparatus. In the semiconductor memory apparatus, the data strobe signal (DQS) is a signal which is outputted to transfer the timing value of data when outputting the data through a data pad.

Since the data strobe signal (DQS) serves as a signal for transferring the timing value of the outputted data as described above, the data strobe signal (DQS) plays an important role in high speed operations of a semiconductor memory apparatus and in applications that use the semiconductor memory apparatus. Therefore, timing-related specifications of the data strobe signal (DQS) including slew rate, Vox, duty, etc. are determined, and the semiconductor memory apparatus is provided with a data strobe signal output driver which can output the data strobe signal (DQS) conforming to the specification.

FIG. 1 is a block diagram illustrating a conventional data strobe signal output driver.

The conventional data strobe signal output driver includes a trigger block 10, a first predriver block 21, a second predriver block 22, and a main driver block 30.

The trigger block 10 receives a first signal rsig, a second signal fsig, a first clock rclk, a second clock fclk, a driver off signal drv_off, a termination enable signal odt_on and a preamble signal pream, and outputs a first predrive signal pup and a second predrive signal dpn.

The first predriver block 21 receives the first predrive signal pup and outputs a first main drive signal up based thereon.

The second predriver block 22 receives the second predrive signal pdn and outputs a second main drive signal dn based thereon.

The main driver block 30 outputs a data strobe signal DQS by charging an output node no according to the first main drive signal up or discharging the output node no according to the second main drive signal dn. The main driver block 30 is generally configured to include a pull-up driver unit (not shown) for charging the output node no and a pull-down driver unit (not shown) for discharging the output node no. The pull-up driver unit is comprised of a PMOS transistor which receives the first main drive signal up, and the pull-down driver unit is comprised of an NMOS transistor which receives the second main drive signal dn.

The data strobe signal output driver generates the first and second predrive signals pup and pdn through the trigger block 10, generates the first and second main drive signals up and dn through the first and second predriver blocks 21 and 22, and outputs the data strobe signal DQS through the main driver block 30. Also, the data strobe signal output driver generates a preamble pulse according to the preamble signal pream before the activation timing of the data strobe signal DQS.

In general, when a semiconductor memory apparatus outputs data, the first and second main drive signals up and dn should have the same value so that the main driver block 30 can generate the data strobe signal DQS by charging or discharging the output node no. Signals for controlling charge or discharge of the output node no by the main driver block 30 are generated by the first and second predriver blocks 21, 22. More specifically, the first main drive signal up and the second main drive signal dn are respectively generated by the first predriver block 21 and the second predriver block 22. Thus, the output waveform of the data strobe signal DQS is determined depending upon how precisely the first main drive signal up and the second main drive signal dn are matched to each other at the same timing.

FIG. 2 is a circuit diagram illustrating the first predriver block 21 and the second predriver block 22 shown in FIG. 1.

The first predriver block 21 includes a first PMOS transistor P1 and a first NMOS transistor N1, which each receive the first predrive signal pup via its respective gate terminal, and a first slew rate resistor Rs1. The second predriver block 22 has the same configuration as the first predriver block 21 and includes a second PMOS transistor P2 and a second NMOS transistor N2, which each receive the second predrive signal pdn via its gate terminal, and a second slew rate resistor Rs2. In the first predriver block 21, the first PMOS transistor P1 and the first NMOS transistor N1 are turned on or off based on the first predrive signal pup, the slew rate of the first predrive signal pup is controlled by the first slew rate resistor Rs1, and the first main drive signal up is output in response thereto. The second predriver block 22 has the same configuration and operates in the same manner as the first predriver block 21.

As described above, the first predriver block 21 and the second predriver block 22 each include a PMOS transistor, a NMOS transistor and a slew rate resistor as shown in FIG. 2. Therefore, because the first main drive signal up and the second main drive signal dn are signals which are respectively output from the first predriver block 21 and the second predriver block 22 as different component parts, the first main drive signal up and the second main drive signal dn may have different timings due to changes in PVT (process, operating voltage and temperature) and a difference between a designed value and a realized value. As such, since the output waveform of the data strobe signal DQS is dependent on how precisely the first main drive signal up and the second main drive signal dn are matched to each, providing the first main drive signal up and the second main drive signal dn via different predriver blocks can serve as a disadvantage to the timing specification of the data strobe signal DQS including slew rate, Vox, duty, etc. As a semiconductor memory apparatus operates at a gradually increasing speed, such a disadvantage may be serious since the timing specification of the data strobe signal DQS is established to conform to the high speed operation.

SUMMARY

In one embodiment of the present invention, a data strobe signal output driver includes: a trigger block configured to receive a first signal, a second signal, a first clock and a second clock, and output a predrive signal; a predriver block configured to receive the predrive signal, a driver off signal and a termination enable signal, and output a first main drive signal and a second main drive signal; and a main driver block configured to output a data strobe signal according to the first and second main drive signals.

BRIEF DESCRIPTION OF THE DRAWINGS

Features, aspects, and embodiments are described in conjunction with the attached drawings, in which:

FIG. 7 is a timing diagram illustrating input/output signals of the data strobe signal output driver in accordance with the embodiment of the present invention.

DETAILED DESCRIPTION

Hereinafter, a data strobe signal output driver according to an embodiment of the present invention will be described below with reference to the accompanying drawings through example embodiments.

Unlike conventional data strobe signal output drivers, in which different predriver blocks receive multiple predrive signals in order to generate corresponding main drive signals, a data strobe signal output driver in accordance with an embodiment of the present invention generates a single predrive signal and then generates main drive signals based on the single predrive signal. As such, timing characteristics of the main drive signals are improved when compared to main drive signals generated by conventional data strobe signal output drivers. Accordingly, effects advantageous to the timing specification of a data strobe signal DQS including slew rate, Vox, duty, etc. can be achieved.

Figure 3:
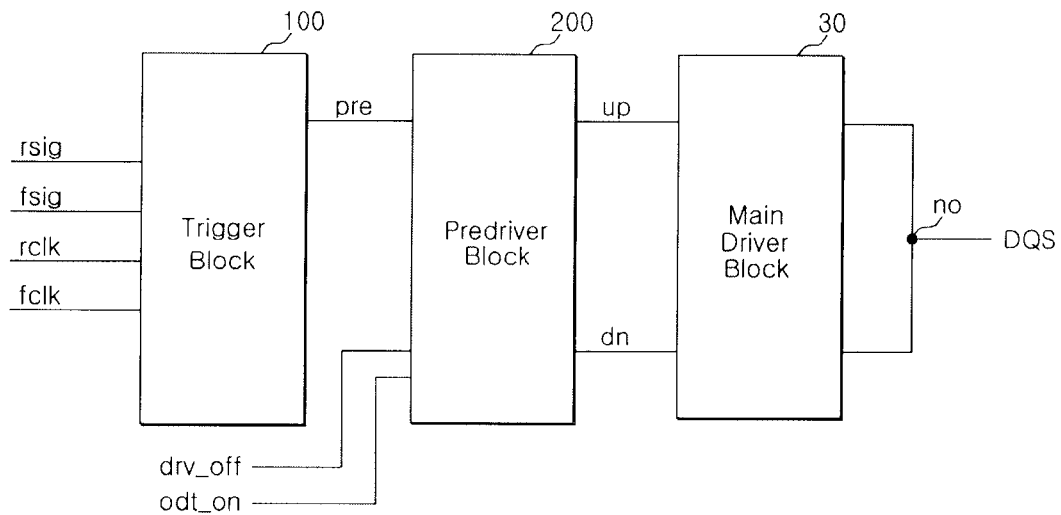
FIG. 3 is a block diagram illustrating a data strobe signal output driver in accordance with an embodiment of the present invention.

FIG. 3 is a block diagram illustrating a data strobe signal output driver in accordance with an embodiment of the present invention.

The data strobe signal output driver includes a trigger block 100, a predriver block 200, and a main driver block 30.

The data strobe signal output driver in accordance with an embodiment of the present invention can operate in three modes, that is, a data strobe signal output mode, a floating mode and a termination mode.

In the data strobe signal output mode, the data strobe signal output driver outputs the data strobe signal DQS which is activated according to the output timing of data (DQ). In the data strobe signal output mode, the data strobe signal DQS has a non-specified voltage level since the data strobe signal DQS is activated according to the output timing of the data (DQ). The data strobe signal output driver generates the data strobe signal DQS by changing the voltage level of an output node no through alternately performing a charging operation and a discharging operation of the output node no.

In the floating mode, the data strobe signal output driver can deactivate the main driver block 30 and maintain the output node no from which the data strobe signal DQS is output in a high impedance (Hi-Z) state (i.e., a floating state).

In the termination mode, the data strobe signal output driver activates the main driver block 30. The main driver block 30 simultaneously charges and discharges the output node no. By controlling the charging and the discharging of the output node no in the termination mode, the output node no, from which the data strobe signal DQS is output, can be made to have a voltage level corresponding to one half of a power supply voltage level.

The trigger block 100 is configured to receive a first signal rsig, a second signal fsig, a first clock rclk and a second clock fclk and generate a predrive signal pre. The trigger block 100 outputs either the first signal rsig or the second signal fsig as the predrive signal pre based on the activation timings of the first clock rclk and the second clock fclk. The first signal rsig and the second signal fsig are signals which maintain a high level and a low level, respectively. Therefore, the predrive signal pre is a signal which transitions to a high level and a low level according to the activation timings of the first clock rclk and the second clock fclk.

Figure 1:
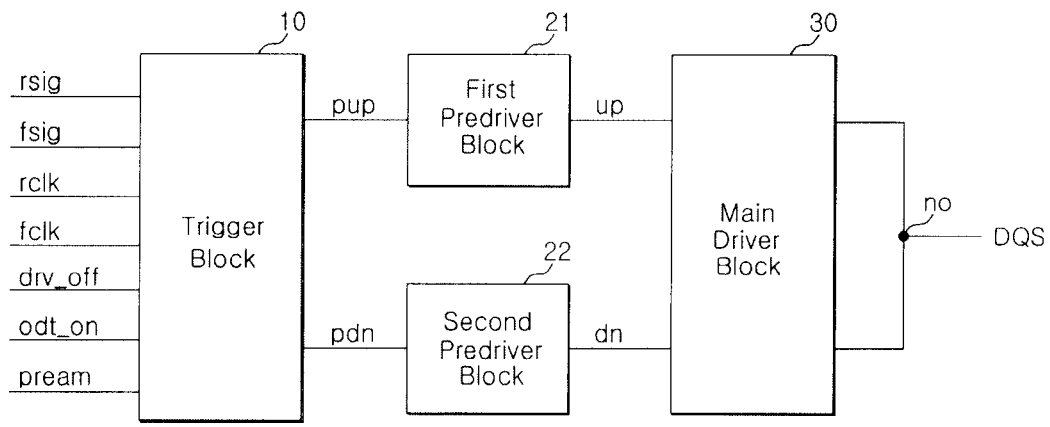
FIG. 1 is a block diagram illustrating a conventional data strobe signal output driver.

The predriver block 200 is configured to receive the predrive signal pre, a driver off signal drv_off and a termination enable signal odt_on and to output the first main drive signal up and the second main drive signal dn based thereon. The driver off signal drv_off is a signal which controls the operation of the data strobe signal output driver in the data strobe signal output mode. For example, if the driver off signal drv_off is activated, the data strobe signal output driver does not operate in the data strobe signal output mode in which the data strobe signal output driver outputs the data strobe signal DQS in conformity with the activation timing of the data. The termination enable signal odt_on is a signal which is activated when a semiconductor memory apparatus including the data strobe signal output driver receives the data through a data pad, and enables an on-die termination operation when the data is input. The data strobe signal output driver operates in the data strobe signal output mode, the floating mode or the termination mode based on the driver off signal drv_off and the termination enable signal odt_on. The predriver block 200 controls a slew rate and a driving force of the predrive signal pre when operating in the data strobe signal output mode, and outputs the first main drive signal up and the second main drive signal dn. In the data strobe signal output mode, unlike the conventional art in which the first main drive signal up and the second main drive signal dn are generated from the two predrive signals pup and pdn as shown in FIG. 1, in an embodiment of the present invention, the first main drive signal up and the second main drive signal dn are generated from the one predrive signal pre. When operating in the floating mode, the predriver block 200 sets and outputs the first main drive signal up and the second main drive signal dn in such a manner that the main driver block 30 can be deactivated. When operating in the termination mode, the predriver block 200 sets and outputs the first main drive signal up and the second main drive signal dn in such a manner that the main driver block 30 can be activated.

The main driver block 30 is configured to output the data strobe signal DQS to the output node no based on the first main drive signal up and the second main drive signal dn. As shown in FIG. 1, the main driver block 30 can include a pull-up driver unit (not shown) and a pull-down driver unit (not shown). The pull-up driver unit can include a PMOS transistor which receives the first main drive signal up, and the pull-down driver unit can include an NMOS transistor which receives the second main drive signal dn.

The data strobe signal output driver in accordance with an embodiment of the present invention shown in FIG. 3 operates with the following differences when compared to the conventional data strobe signal output driver.

In the conventional data strobe signal output driver shown in FIG. 1, the trigger block 10 generates two predrive signals pup and pdn, and each of the two predrive blocks 21 and 22 receive a respective one of the two predrive signals pup and pdn and generate the first main drive signal up and the second main drive signal dn based on thereon. However, in the data strobe signal output driver in accordance with an embodiment of the present invention, the trigger block 100 generates a single predrive signal pre, and the predriver block 200 generates the first main drive signal up and the second main drive signal dn using the single predrive signal pre. Generating the first main drive signal up and the second main drive signal dn using the single predrive signal pre according to the present disclosure provides an advantage to the timing characteristics of the data strobe signal DQS because component parts of a semiconductor memory apparatus may have undesired characteristics due to changes in PVT (process, operating voltage and temperature) and a difference between a designed value and a realized value. In this regard, in the conventional data strobe signal output driver, the timing characteristics of the two predrive signals can be different from each other due to the main drive signals being generated by two predriver blocks, which can degrade the timing characteristics of the data strobe signal DQS. Conversely, in the data strobe signal output driver in accordance with an embodiment of the present invention, because the first main drive signal up and the second main drive signal dn are generated based on the single predrive signal pre, the timing characteristics of the data strobe signal DQS are improved as compared to the timing characteristics of the data strobe signal DQS output according to the conventional art. Even when the timing characteristics of the predrive signal pre or the predriver block 200 are changed due to changes in PVT (process, operating voltage and temperature) and a difference between a designed value and a realized value, the first main drive signal up and the second main drive signal dn are simultaneously influenced in the same way due to the single predrive signal, and therefore, the timing characteristics of the data strobe signal DQS are improved as compared to the timing characteristics of the data strobe signal DQS output according to the conventional art.

Moreover, the conventional data strobe signal output driver shown in FIG. 1, the trigger block 10 receives the drive off signal drv_off and the termination enable signal odt_on, and determines in which mode (e.g., the data strobe signal output mode, the floating mode, or the termination mode) the conventional data strobe signal output driver operates. However, the data strobe signal output driver in accordance with an embodiment of the present invention, the predriver block 200 receives the driver off signal drv_off and the termination enable signal odt_on, and determines in which mode (e.g., the data strobe signal output mode, the floating mode, or the termination mode) the data strobe signal output driver in accordance with an embodiment of the present invention operates.

Figure 4:
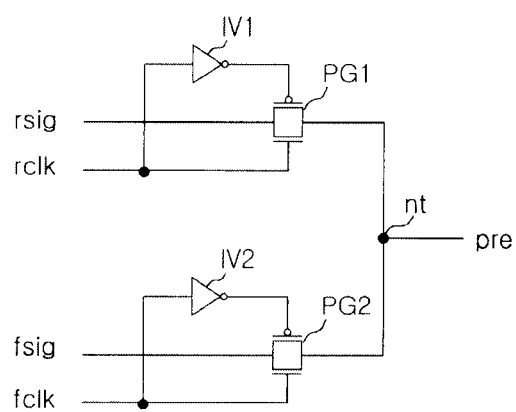
FIG. 4 is a detailed circuit diagram of the trigger block shown in FIG. 3.

FIG. 4 is a circuit diagram illustrating an exemplary embodiment of the trigger block 100 shown in FIG. 3.

The trigger block 100 can include a first inverter IV1, a second inverter IV2, a first pass gate PG1, and a second pass gate PG2. In one example, the first pass gate can comprise and an NMOS transistor and a PMOS transistor as shown. Similarly, in one example, the second pass gate PG2 can comprise an NMOS transistor and a PMOS transistor as shown. The first pass gate PG1 receives the first signal rsig via its input terminal and is coupled with a trigger node nt. The second pass gate PG2 receives the second signal fsig via its input terminal and is coupled with the trigger node nt. The NMOS transistor gate terminal of the first pass gate PG1 receives the first clock rclk, and the PMOS transistor gate terminal of the first pass gate PG1 receives an inverted clock of the first clock rclk from the first inverter IV1. The NMOS gate transistor terminal of the second pass gate PG2 receives the second clock fclk, and the PMOS transistor gate terminal of the second pass gate PG2 receives an inverted clock of the second clock fclk from the second inverter IV2. The trigger block 100 outputs the first signal rsig as the predrive signal pre according to the first clock rclk and outputs the second signal fsig as the predrive signal pre according to the second clock fclk.

In the conventional art as shown in FIG. 1, the trigger block 10 generates the first predrive signal pup and the second predrive signal pdn through separate component parts. Accordingly, the timing of the first predrive signal pup and the second predrive signal pdn can be mismatched with each other due to changes in PVT and a differences between designed values and realized values. However, in an embodiment of the present invention, mismatched timing resulting from inclusion of different component parts can be avoided due to the trigger block 100 generating the single predrive signal pre.

Figure 5:
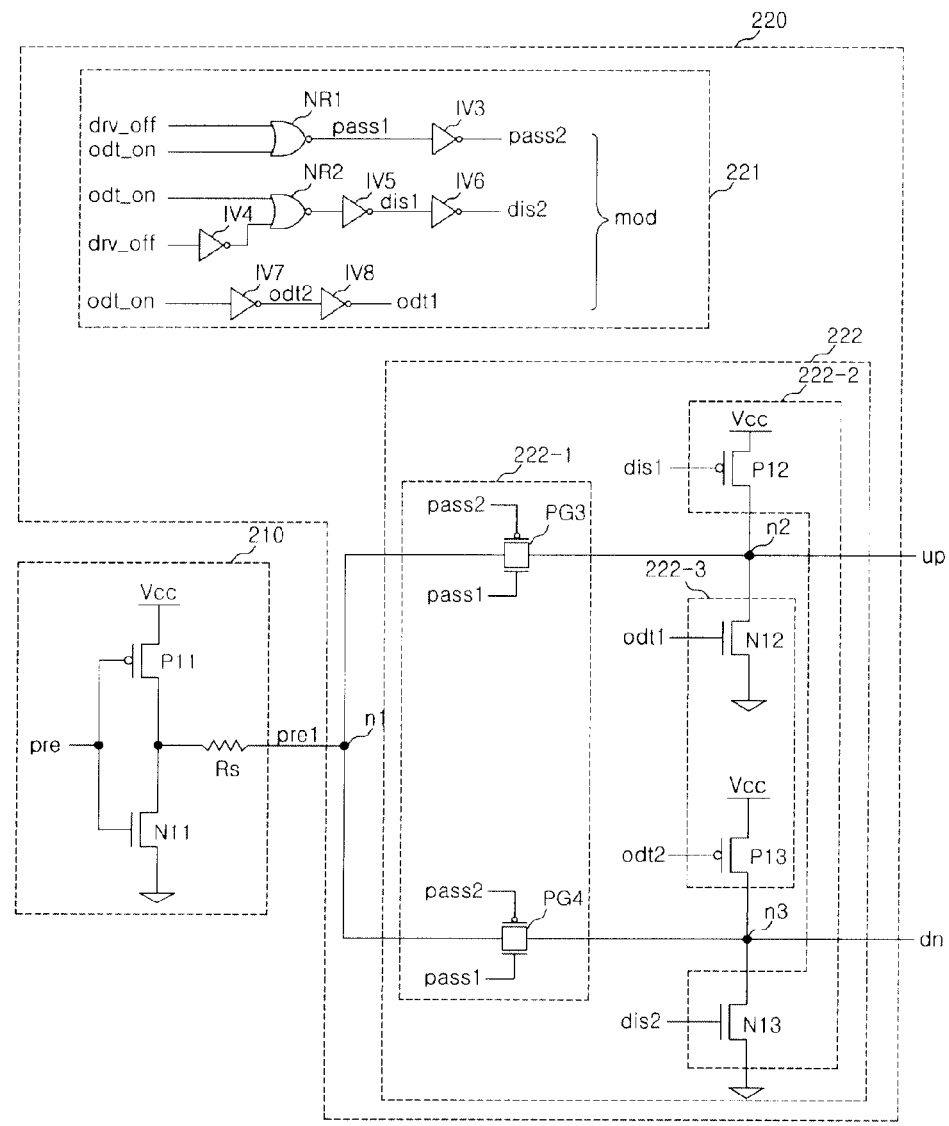
FIG. 5 is a detailed circuit diagram of the predriver block shown in FIG. 3.

FIG. 5 is a circuit diagram illustrating an example embodiment of the predriver block 200 shown in FIG. 3.

The predriver block 200 can include a driving unit 210 and an option unit 220.

The driving unit 210 is configured to receive the predrive signal pre and to generate a driving predrive signal pre1 based thereon.

The option unit 220 is configured to set the first main drive signal up and the second main drive signal dn to the voltage level of the driving predrive signal pre1 or to a specified (e.g., predetermined) voltage level based on the driver off signal drv_off and the termination enable signal odt_on, and to output the the first main drive signal up and the second main drive signal dn.

Figure 2:
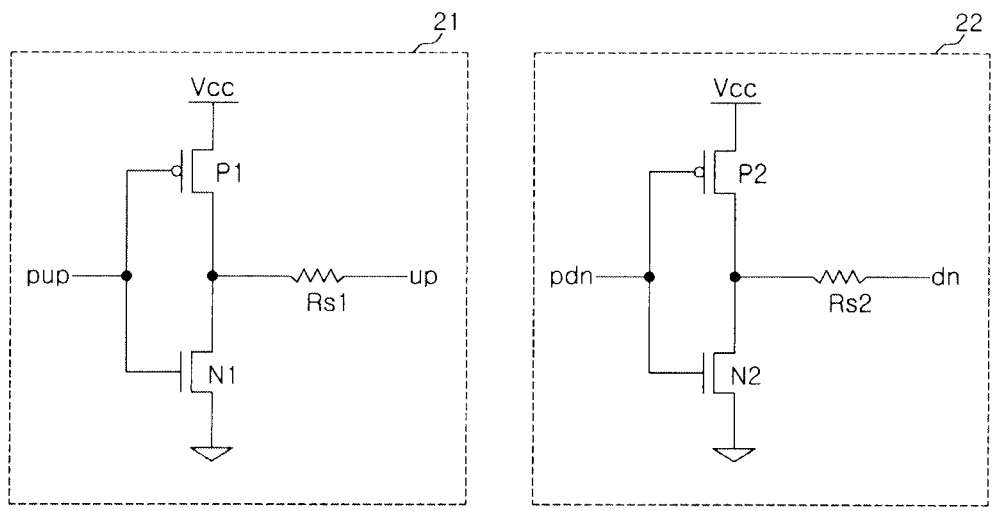
FIG. 2 is a circuit diagram illustrating the first predriver block and the second predriver block shown in FIG. 1.

The driving unit 210 includes a first PMOS transistor P11, a first NMOS transistor N11, and a slew rate resistor Rs. The first PMOS transistor P11 has a source terminal which is coupled to a power supply voltage Vcc and a drain terminal which is coupled to the drain terminal of the first NMOS transistor N11 and the slew rate resistor Rs. The first PMOS transistor P11 receives the predrive signal pre via its gate terminal. The first NMOS transistor N11 has a source terminal which is coupled to a ground voltage, and receives the predrive signal pre via its gate terminal. The slew rate resistor Rs is coupled to a drain terminal of the first PMOS transistor P11, a drain terminal of the first NMOS transistor N11 and a driving node n1. The driving unit 210 generates the driving predrive signal pre1 by controlling the driving force and the slew rate of the predrive signal pre. Unlike the predriver blocks 21 and 22 according to the conventional art shown in FIG. 2, the driving unit 210 of the predriver block 200 generates the driving predrive signal pre1 via a single driver.

The option unit 220 allows the data strobe signal output driver to operate in the data strobe signal output mode, the floating mode or the termination mode based on the driver off signal drv_off and the termination enable signal odt_on.

The option unit 220 can include an operation mode determining section 221 and a mode performing section 222.

The operation mode determining section 221 is configured to generate an operation mode determining signal mod based on the driver off signal drv_off and the termination enable signal odt_on, allowing the mode performing section 222 to operate in either the data strobe signal output mode, the floating mode or the termination mode.

The mode performing section 222 is configured to output the driving predrive signal pre1 as the first and second main drive signals up and dn, respectively, or to set the first and second main drive signals up and dn to specified voltage levels based on the operation mode determining signal mod. The mode performing section 222 can include a first output portion 222-1, a second output portion 222-2 and a third output portion 222-3.

The operation mode determining section 221 determines an operation mode according to the driver off signal drv_off and the termination enable signal odt_on, and generates the operation mode determining signal mod according to the determined operation mode. The operation mode determining signal mod is a signal which is input to each of the first output portion 222-1, the second output portion 222-2 and the third output portion 222-3 of the mode performing section 222.

The first output portion 222-1 is configured to output the driving predrive signal pre1 as the first main drive signal up and the second main drive signal dn in response to the operation mode determining signal mod.

The second output portion 222-2 is configured to set and output the first main drive signal up and the second main drive signal dn in response to the operation mode determining signal mod in such a manner that the main driver block 30 is deactivated.

The third output portion 222-3 is configured to set and output the first main drive signal up and the second main drive signal dn in response to the operation mode determining signal mod in such a manner that the main driver block 30 is activated.

The operation mode determining section 221 can include third, fourth, fifth, sixth, seventh, and eighth inverters IV3, IV4, IV5, IV6, IV7, and IV8, respectively; a first NOR gate NR1; and a second NOR gate NR2. The first NOR gate NR1 receives and performs a NOR operation on the driver off signal drv_off and the termination enable signal odt_on, and outputs a first pass signal pass1 based thereon. The third inverter IV3 inverts the first pass signal pass1 and outputs a second pass signal pass2 based thereon. The first pass signal pass1 and the second pass signal pass2 serve as the operation mode determining signal mod and control activation of the data strobe signal output mode. The fourth inverter IV4 inverts and outputs the driver off signal drv_off based thereon. The second NOR gate NR2 performs a NOR operation on the termination enable signal odt_on and the signal output from the fourth inverter IV4 and outputs a signal based thereon. The fifth inverter IV5 inverts the signal output from the second NOR gate NR2 and outputs a first disable signal dis1 based thereon. The sixth inverter IV6 inverts the first disable signal dis1 and outputs a second disable signal dis2 based thereon. The first disable signal dis1 and the second disable signal dis2 serve as the operation mode determining signal mod and control the activation of the floating mode. The seventh inverter IV7 inverts the termination enable signal odt_on and outputs a second termination signal odt2 based thereon. The eighth inverter IV8 inverts the second termination signal odt2 and outputs a first termination signal odt1 based thereon. The first termination signal odt1 and the second termination signal odt2 serve as the operation mode determining signal mod and control the activation of the termination mode.

The operation mode determining section 221 shown in FIG. 5 operates as described below. When the driver off signal drv_off is deactivated and the termination enable signal odt_on is deactivated, the operation mode determining section 221 activates and outputs the first pass signal pass1 and the second pass signal pass2. If the first pass signal pass1 and the second pass signal pass2 are activated, the data strobe signal output mode is activated. Also, when the driver off signal drv_off is activated and the termination enable signal odt_on is deactivated, the operation mode determining section 221 activates and outputs the first disable signal dis1 and the second disable signal dis2. If the first disable signal dis1 and the second disable signal dis2 are activated, the floating mode is activated. Further, when the driver off signal drv_off is activated and the termination enable signal odt_on is activated, the operation mode determining section 221 activates and outputs the first termination signal odt1 and the second termination signal odt2. If the first termination signal odt1 and the second termination signal odt2 are activated, the termination mode is activated.

The first output portion 222-1 can include a third pass gate PG3 and a fourth pass gate PG4. In one example, the first pass gate can comprise and an NMOS transistor and a PMOS transistor as shown. Similarly, in one example, the second pass gate PG2 can comprise an NMOS transistor and a PMOS transistor as shown. The third pass gate PG3 receives the first pass signal pass1 and the second pass signal pass2 via its NMOS transistor gate terminal and its PMOS transistor gate terminal, respectively, and is coupled between the driving node n1 and a first node n2 as shown. The fourth pass gate PG4 receives the first pass signal pass1 and the second pass signal pass2 via its NMOS transistor gate terminal and its PMOS transistor gate terminal, respectively, and is coupled between the driving node n1 and a second node n3 as shown. The first output portion 222-1 provides the driving predrive signal pre1 applied to the driving node n1 as the first main drive signal up and the second main drive signal dn when the first pass signal pass1 and the second pass signal pass2 are activated. That is to say, operation is performed in the data strobe signal output mode.

The second output portion 222-2 can include a second PMOS transistor P12 and a third NMOS transistor N13. The second PMOS transistor P12 is coupled between a power supply voltage Vcc and the first node n2, and receives the first disable signal dis1 via its gate terminal. The third NMOS transistor N13 is coupled between the second node n3 and the ground voltage, and receives the second disable signal dis2 via its gate terminal. The second PMOS transistor P12 and the third NMOS transistor N13 turn on when the first disable signal dis1 and the second disable signal dis2 are activated, and set the first node n2 and the second node n3 to a high level and a low level, respectively. Accordingly, the first main drive signal up is output to a high level and the second main drive signal dn is output to a low level, by which the main driver block 30 is deactivated. That is to say, the main driver block 30 operates in the floating mode.

The third output portion 222-3 can include a second NMOS transistor N12 and a third PMOS transistor P13. The second NMOS transistor N12 is coupled between the first node n2 and the ground voltage, and receives the first termination signal odt1 via its gate terminal. The third PMOS transistor P13 is coupled between the power supply voltage Vcc and the second node n3, and receives the second termination signal odt2 via its gate terminal. The second NMOS transistor N12 and the third PMOS transistor P13 turn on when the first termination signal odt1 and the second termination signal odt2 are activated, and set the first node n2 and the second node n3 to a low level and a high level, respectively. Accordingly, the first main drive signal up is output to a low level and the second main drive signal do is output to a high level, by which the main driver block 30 is activated. That is to say, the main driver block 30 operates in the termination mode.

The operations of the predriver block 200 shown in FIG. 5 are described below. As noted above, the data strobe signal output driver in accordance with an embodiment of the present invention can operate in one of the three modes (i.e., the data strobe signal output mode, the floating mode, and the termination mode).

In the data strobe signal output mode, the driver off signal drv_off is input by being deactivated, and the termination enable signal odt_on is input by being deactivated as well. In the predriver block 200 shown in FIG. 5, the driver off signal drv_off and the termination enable signal odt_on can be activation signals for example. In other words, in the data strobe signal output mode, the driver off signal drv_off has a low level, and the termination enable signal odt_on also has a low level. Accordingly, the third pass gate PG3 is open, and the second PMOS transistor P12 and the second NMOS transistor N12 are turned off. Further, the fourth pass gate PG4 is open, and the third PMOS transistor P13 and the third NMOS transistor N13 are turned off. As a consequence, the driving predrive signal pre1 which is generated in the driving unit 210 is output as the first main drive signal up and the second main drive signal dn.

In the floating mode, the driver off signal drv_off has a high level and the termination enable signal odt_on has a low level. Accordingly, the third pass gate PG3 is closed, and the second PMOS transistor P12 is turned on and the second NMOS transistor N12 is turned off. Further, the fourth pass gate PG4 is closed, and the third PMOS transistor P13 is turned off and the third NMOS transistor N13 is turned on. As such, the driving predrive signal pre1, which is generated in the driving unit 210, is blocked by the pass gate PG3 and the fourth pass gate PG4, and the first main drive signal up and the second main drive signal dn are set to specified voltage levels and are then output. The predriver block 200 shown in FIG. 5 outputs the first main drive signal up at a high level and the second main drive signal dn at a low level. Accordingly, the main driver 30 is deactivated, and the output node no is maintained in the high impedance (Hi-Z) state.

In the termination mode, the driver off signal drv_off is at a high level and the termination enable signal odt_on also is at a high level. Accordingly, the third pass gate PG3 is closed, and the second PMOS transistor P12 is turned off and the second NMOS transistor N12 is turned on. Moreover, the fourth pass gate PG4 is closed, and the third PMOS transistor P13 is turned on and the third NMOS transistor N13 is turned off. As such, the driving predrive signal pre1, which is generated in the driving unit 210, is blocked by the third pass gate PG3 and the fourth pass gate PG4, and the first main drive signal up and the second main drive signal dn are output to specified voltage levels. The predriver block 200 shown in FIG. 5 outputs the first main drive signal up at a low level and the second main drive signal dn at a high level. Accordingly, the main driver 30 is activated.

The first main drive signal up and the second main drive signal dn have different specified voltage levels in the floating mode and the termination mode. In the floating mode, the predriver block 200 shown in FIG. 5 outputs the first main drive signal at a high level and the second main drive signal dn at a low level. In the termination mode, the predriver block 200 shown in FIG. 5 outputs the first main drive signal at a low level and the second main drive signal dn at a high level. In the floating mode and the termination mode, if the first main drive signal up is output to a first specified voltage level, the second main drive signal dn is output to a second specified voltage level that is different from the first specified voltage level. In general, these voltage levels are set because the main drive block 30 includes a PMOS transistor for receiving the first main drive signal up and an NMOS transistor for receiving the second main drive signal dn, and therefore may be changed as desired to conform with a particular design by one of ordinary skill in the art.

Figure 6:
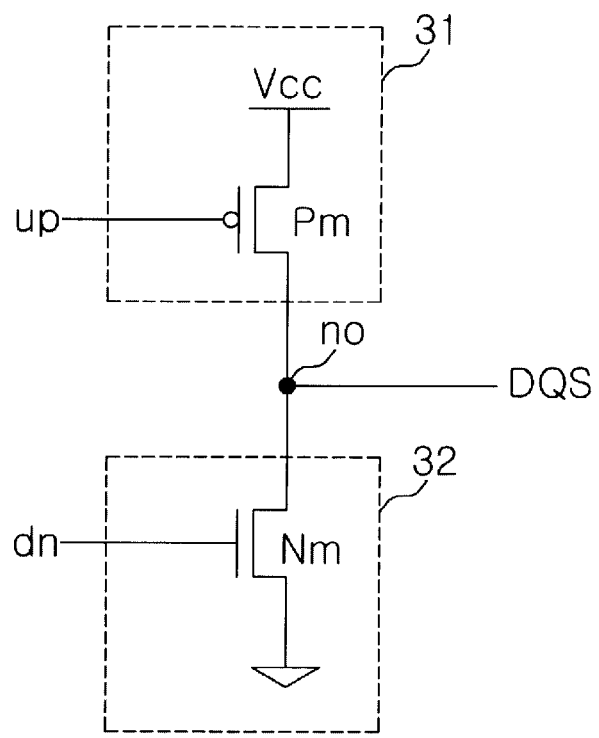
FIG. 6 is a detailed circuit diagram of the main driver block shown in FIG. 3.

FIG. 6 is a circuit diagram illustrating an example embodiment of the main driver block 30 shown in FIG. 3.

As described above, the main driver block 30 can include a pull-up driver unit 31 and a pull-down driver unit 32. The pull-up driver unit 31 can include a main PMOS transistor Pm which receives the first main drive signal up via its gate terminal and charges the output node no based thereon. The pull-down driver unit 32 can include a main NMOS transistor Nm which receives the second main drive signal dn via its gate terminal and discharges the output node no based thereon. In the data strobe signal output mode, the pull-up driver unit 31 and the pull-down driver unit 32 can receive the driving predrive signal pre1 as the first and second main drive signals up and dn, respectively, and output the data strobe signal DQS based thereon. Also, in the floating mode, both the pull-up driver unit 31 and the pull-down driver unit 32 can be deactivated and maintain the output node no in the high impedance state. Further, in the termination mode, both the pull-up driver unit 31 and the pull-down driver unit 32 can be activated and simultaneously perform the charging operation and the discharging operation for the output node no.

In the data strobe signal output driver in accordance with an embodiment of the present invention, in the data strobe signal output mode, the first main drive signal up and the second main drive signal dn are generated using one driving predrive signal pre1. Accordingly, when comparing the first main drive signal up and the second main drive signal dn according to an embodiment of the present invention with the first main drive signal up and the second main drive signal dn according to the conventional art, improved timing-related characteristics can be achieved, and accordingly, the timing characteristics of the data strobe signal DQS including slew rate, Vox, duty, etc. can be improved when compared to the conventional art.

FIG. 7 is a timing diagram illustrating input/output signals of the data strobe signal output driver in accordance with an embodiment of the present invention.

The data strobe signal output driver starts to operate in the data strobe signal output mode at time (a). That is to say, at time (a) when the driver off signal drv_off is deactivated to a low level and the termination enable signal odt_on is deactivated to a low level, the first main drive signal up and the second main drive signal dn are output according to the single predrive signal pre, which is generated by the trigger block 100.

At a time when the drive off signal drv_off falls to the low level, that is, at time (a), the second main drive signal dn transitions from the low level to the high level. Thereafter, at time (b) when the first pulse of the predrive signal pre starts, the second main drive signal dn starts to pulse at a low level. As the second main drive signal dn transitions to a high level at time (a) and maintains the high level through time (b), the preamble of the data strobe signal DQS is generated. In the conventional data strobe signal output driver, in order to generate the preamble of the data strobe signal DQS, a separate preamble signal pream is needed. However, in the data strobe signal output driver in accordance with an embodiment of the present invention, a pulse is generated in the second main drive signal dn from the time when the driver off signal drv_off falls to a low level (ie., time (a)). As such, since the preamble of the data strobe signal DQS is generated, the separate preamble signal pream is not needed. In the data strobe signal output driver in accordance with an embodiment of the present invention, there is no need for the preamble signal pream, and therefore drivers necessary to generate the preamble signal pream is also not required. As such, power consumption can be reduced and efficiency can be improved.

When considering that the data strobe signal output driver is provided for each data pad, the power consumption reduction effect and the efficiency improvement can be substantial.

While certain embodiments have been described above, it will be understood to those skilled in the art that the embodiments described are by way of example only. Accordingly, the data strobe signal output driver described herein should not be limited based on the described embodiments. Rather, the data strobe signal output driver described herein should only be limited in light of the claims that follow when taken in conjunction with the above description and accompanying drawings.

What is claimed is:

1. A data strobe signal output driver comprising:
a trigger block configured to receive a first signal, a second signal, a first clock and a second clock, and to output a predrive signal based thereon;
a predriver block configured to receive the predrive signal, a driver off signal and a termination enable signal, and to output a first main drive signal and a second main drive signal based thereon and configured to determine an operation mode in response to the driver off signal and the termination enable signal; and
a main driver block configured to output a data strobe signal based on the first and second main drive signals.

2. The data strobe signal output driver according to claim 1, wherein the trigger block is configured to output the first signal as the predrive signal based on the first clock and outputs the second signal as the predrive signal based on the second clock.

3. The data strobe signal output driver according to claim 1, wherein the predriver block comprises:
a driving unit configured to receive the predrive signal and generate a driving predrive signal based thereon; and
an option unit configured to provide one of: the driving predrive signal as the first main drive signal and the second main drive signal based on the driver off signal and the termination enable signal; and at least one predetermined voltage as the first main drive signal and the second main drive signal.

4. The data strobe signal output driver according to claim 3, wherein the option unit is configured to output the driving predrive signal as the first main drive signal and the second main drive signal when the drive off signal is deactivated, and to provide the at least one predetermined voltage as the first main drive signal and the second main drive signal based on the termination enable signal when the driver off signal is activated.

5. The data strobe signal output driver according to claim 4, wherein the main driver block comprises a pull-up driver unit and a pull-down driver unit, and
wherein the first main drive signal and the second main drive signal activate the pull-up driver unit and the pull-down driver unit when the driver off signal is activated and the termination enable signal is activated.

6. The data strobe signal output driver according to claim 4, wherein the main driver block comprises a pull-up driver unit and a pull-down driver unit, and
wherein the first main drive signal and the second main drive signal deactivate the pull-up driver unit and the pull-down driver unit when the driver off signal is activated and the termination enable signal is deactivated.

7. The data strobe signal output driver according to claim 4, wherein the main driver block comprises a pull-up driver unit and a pull-down driver unit, and
wherein the option unit comprises:
an operation mode determining section configured to generate an operation mode determining signal based on the driver off signal and the termination enable signal;
a first output portion configured to output the driving predrive signal as the first main drive signal and the second main drive signal in response to the operation mode determining signal;
a second output portion configured to provide the first main drive signal and the second main drive signal in response to the operation mode determining signal, wherein the first main drive signal and the second main drive signal activate the pull-up driver unit and the pull-down driver unit; and
a third output portion configured to provide the first main drive signal and the second main drive signal in response to the operation mode determining signal, wherein the first main drive signal and the second main drive signal deactivate the pull-up driver unit and the pull-down driver unit.

8. A data strobe signal output driver comprising:
an operation mode determining section configured to output an operation mode determining signal in response to a driver off signal and a termination enable signal, wherein the operation mode determining signal includes information indicating an operation mode corresponding to at least one of: a data strobe signal output mode, a floating mode, and a termination mode;
a mode performing section configured to, in response to the operation mode determining signal, provide one of: a driving predrive signal as a first main drive signal and second main drive signal, and at least one predetermined voltage as the first main drive signal and the second main drive signal; and
a main driver block configured to output a data strobe signal in response to the first main drive signal and the second main drive signal.

9. The data strobe signal output driver according to claim 8, wherein the mode performing section provides the driving predrive signal as the first main driving signal and the second main drive signal when the operation mode corresponds to the data strobe signal output mode.

10. The data strobe signal output driver according to claim 8, wherein the mode performing section provides the at least one predetermined voltage as the first main driving signal and the second main driving signal when the operation mode corresponds to at least one of: the floating mode and the termination enable mode.

11. The data strobe signal output driver according to claim 10, wherein the main driver block is deactivated when the operation mode corresponds to the floating mode.

12. The data strobe signal output driver according to claim 10, wherein the main driver block is activated when the operation mode corresponds to the termination mode.

13. The data strobe signal output driver according to claim 10,
wherein the main driver block includes pull-up and pull-down driver units, and wherein both the pull-up and pull-down driver units are turned off when the operation mode corresponds to the floating mode and wherein both the pull-up and pull-down driver units are turned on when the operation mode corresponds to the termination mode.

* * * * *

UNITED STATES PATENT AND TRADEMARK OFFICE
CERTIFICATE OF CORRECTION

PATENT NO. : 8,441,870 B2  
APPLICATION NO. : 12/846358  
DATED : May 14, 2013  
INVENTOR(S) : Mi Hye Kim

Page 1 of 1

It is certified that error appears in the above-identified patent and that said Letters Patent is hereby corrected as shown below:

Title Page, Item (73) Assignee "SK Hynic Inc." should read --SK Hynix Inc.--

Signed and Sealed this  
Twenty-ninth Day of April, 2014

Michelle K. Lee  
*Deputy Director of the United States Patent and Trademark Office*